United States Patent
Neyret et al.

(10) Patent No.: US 7,138,344 B2
(45) Date of Patent: Nov. 21, 2006

(54) METHOD FOR MINIMIZING SLIP LINE FAULTS ON A SEMICONDUCTOR WAFER SURFACE

(75) Inventors: Eric Neyret, Sassenage (FR); Christophe Maleville, La Terrasse (FR); Ludovic Ecarnot, Gieres (FR)

(73) Assignee: S.O.I.Tec Silicon on Insulator Technologies S.A., Bernin (FR)

(*) Notice: Subject to any disclaimer, the term of this patent is extended or adjusted under 35 U.S.C. 154(b) by 91 days.

(21) Appl. No.: 10/671,813

(22) Filed: Sep. 25, 2003

(65) Prior Publication Data
US 2004/0106303 A1 Jun. 3, 2004

(30) Foreign Application Priority Data
Oct. 1, 2002 (FR) .................................. 02 12120

(51) Int. Cl.
*H01L 21/26* (2006.01)
*H01L 21/42* (2006.01)
*H01L 21/324* (2006.01)
*H01L 21/477* (2006.01)

(52) U.S. Cl. ............... 438/799; 438/530; 438/715
(58) Field of Classification Search ................ 438/40, 438/663, 799, 530, 308, 311, 715, 795
See application file for complete search history.

(56) References Cited

U.S. PATENT DOCUMENTS

| 5,359,693 A | 10/1994 | Nenyei et al. ............... 392/418 |
| 2002/0009841 A1 | 1/2002 | Hayashi et al. ............. 438/189 |

FOREIGN PATENT DOCUMENTS

| EP | 1 041 612 A1 | 4/2000 |
| EP | 1 193 749 A2 | 4/2002 |
| FR | 2 797 713 | 2/2001 |
| JP | 07321120 | 12/1995 |

*Primary Examiner*—Hoai Pham
*Assistant Examiner*—Dilinh Nguyen
(74) *Attorney, Agent, or Firm*—Winston & Strawn LLP

(57) ABSTRACT

A method for minimizing slip line faults on a surface of a semiconductor wafer that has been obtained using a transfer technique. The method includes heating the semiconductor wafer from an ambient temperature to a first higher temperature and pausing the heating at the first higher temperature for a time sufficient to stabilize the wafer. Then the wafer is heated further from the first higher temperature to a target higher temperature during a predetermined time interval. The further heating during an initial portion of the time interval is conducted at a relatively low heating rate and the heating during a final portion of the time interval is conducted at a relatively higher heating rate to thus minimize slip line faults in the surface of the wafer.

20 Claims, 2 Drawing Sheets

METHOD FOR MINIMIZING SLIP LINE FAULTS ON A SEMICONDUCTOR WAFER SURFACE

BACKGROUND ART

This invention generally relates to treating the surface of semiconductor wafers intended for use in microelectronics, optics and optoelectronics applications. A particular example described herein concerns an SOI (Silicon On Insulator) type wafer. In particular, the invention concerns a method for minimizing slip line faults on the semiconductor surface that includes heating the wafer to a first higher temperature, a pause at the first temperature to stabilize the wafer, and further heating the wafer during a predetermined time period to a target higher temperature. The semiconductor wafers relating to the invention are formed via a layer transfer technique, which means that at least one layer (corresponding to all or a part of the wafer) has been transferred from a source substrate onto a support.

The term "rapid annealing" means annealing that takes the wafers to very high temperatures (about 1100° C. or more), in a very short time (a few tens of seconds). This type of annealing is commonly referred to as Rapid Thermal Annealing (RTA). RTA allows the surface of the wafers to be smoothed.

FIG. 1 is a graph that illustrates how RTA is currently practiced, with a curve that shows how the temperature T increases over time t. The graph illustrates that the RTA process includes two ramps where the temperature rises, which takes the wafers subject to the RTA from room temperature (RT) to a high, end-of-annealing temperature T2 in a very short time. For example, RT can range from between about 20° C. and 500° C., and T2 can be about 1200° C.

FIG. 1 shows that the RTA process comprises two rectilinear ramps. The first ramp takes the wafer from room temperature RT to a temperature T1 of about 750° C., which is followed by a halt or pause of about 10 seconds at this same temperature. This first ramp and the pause initiates heating, and permits initiation of the rise to a follow-up temperature of the wafer (the follow-up temperature is measured by a pyrometer which is capable of determining the temperature of the wafer. But the temperature of the wafer only becomes "readable" by the pyrometer after a certain temperature threshold is reached, which depends on the material of the wafer—in the case of a wafer of silicon the temperature threshold is about 400° C.). The first ramp and the pause also permits the temperature to be stabilized (which is the particular role of the halt). After the pause, the RTA process continues with a second ramp having a slope of about 50° C. per second followed by a halt or pause of about 30 seconds. This second ramp is an important active phase of the RTA process.

It has been observed that such conventional RTA processes cause faults to appear in the wafers, particularly in the case of silicon wafers (SOI for example). These faults are known as slip lines and result from the thermal constraints that the wafer is subject to during RTA. These thermal constraints result from the very steep ramps or steep temperature increases, as well as because of the final halt or pause at a very high temperature. Therefore, more or less slip lines will be observed on a wafer subjected to a conventional RTA process depending on the thermal budget applied to the wafer.

Slip lines are likely to appear over the entire surface of the wafer, and notably on the elements that support the wafer inside the annealing oven. Such slip lines are detrimental.

SUMMARY OF THE INVENTION

Presented is a method for minimizing slip line faults on a surface of a semiconductor wafer that has been obtained using a transfer technique. The method includes heating the semiconductor wafer from an ambient temperature to a first higher temperature and pausing the heating at the first higher temperature for a time sufficient to stabilize the wafer. The wafer is then heated further from the first higher temperature to a target higher temperature during a predetermined time interval. The further heating during an initial portion of the time interval is conducted at a relatively low heating rate and the heating during a final portion of the time interval is conducted at a relatively higher heating rate to thus minimize slip line faults in the surface of the wafer.

In an advantageous implementation, heating during the predetermined time interval is not uniform and overall may be less than 50° C./sec, and the further heating may continuously increase from the low heating rate to the high heating rate. Further, it is desirable to conduct the low heating rate from more than 50% to about 80% of the predetermined time interval and the high heating rate from about less than 50% to about 20% of the predetermined time interval. In a variation, a pause may occur in the further heating during the initial portion of the time interval before heating is resumed.

In a preferred implementation, the ambient temperature is room temperature and the first higher temperature is about 700 to 800° C. In addition, the low heating rate of the further heating may be conducted from the first higher temperature to an intermediate temperature of between about 800 to about 1100° C., and the high heating rate of the further heating may be conducted from the intermediate temperature to the target temperature. The target temperature may be about 1100 to 1300° C., and the high heating rate of the further heating is about 25 to 50° C. per second. In an embodiment, the wafer is made of silicon, and the wafer may be an SOI wafer.

Another implementation of the invention is a method for minimizing slip line faults on a surface of a semiconductor wafer that has been obtained using a transfer technique. This technique includes heating such semiconductor wafer from an ambient temperature to a first higher temperature of about 700 to 800° C., and then halting the heating at the first higher temperature for a time sufficient to stabilize the wafer. The wafer is then heated further from the first higher temperature to a target higher temperature of about 1100 to 1300° C. during a predetermined time interval. The further heating during an initial portion of the time interval is conducted continuously at a relatively low heating rate from the first higher temperature to an intermediate temperature of about 800 to 1100° C. The further heating is next continued and at a relatively higher heating rate during a final portion of the time interval to the target temperature to thus minimize slip line faults in the surface of the wafer.

Yet another implementation concerns a method for minimizing slip line faults on a surface of a semiconductor wafer that has been obtained using a transfer technique, wherein the wafer has been heated from an ambient temperature to a first higher temperature. A pause is then taken at the first higher temperature for a time sufficient to stabilize the wafer. The improvement includes heating the wafer from the first higher temperature to a target higher temperature during a predetermined time interval. During an initial portion of the time interval, heating is conducted at a relatively low heating rate. During a final portion of the time interval heating is conducted at a relatively higher heating rate, and this process minimizes slip line faults in the surface of the wafer.

BRIEF DESCRIPTION OF THE DRAWINGS

Other aspects, goals and advantages of the invention will become apparent upon reading the following detailed description of the invention with reference to the drawings, in which.

DETAILED DESCRIPTION OF THE PREFERRED EMBODIMENTS

The invention concerns a surface treatment process for a semiconductor wafer that has been obtained via a transfer technique, and in an implementation the process includes a rapid annealing stage. The rapid annealing stage includes a first temperature rise to a higher initial temperature, a first pause or halt to stabilize the temperature, and a second heating stage to a target higher temperature. The second heating stage occurs for a predetermined time interval. The heating during an initial stage of the time interval is relatively low, whereas the heating during a final portion of the time interval is relatively high. The wafer may be made from silicon, and may be an SOI wafer.

In a preferred embodiment, the halt after the first heating stage takes place at a temperature of about 750° C. In addition, during the second heating stage the range of temperatures of the initial portion of the time interval is from about 800 to about 1100° C. Further, the second heating stage ends at a temperature of about 1150 to 1250° C., and near the end of the final portion of the time interval the heating rate is about 25 to 50° C. per second.

Figure 1:
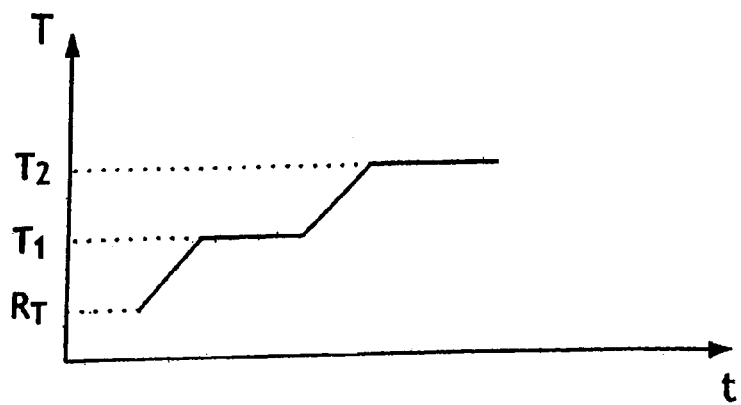
FIG. 1 is a graph illustrating a curve of the temperature T over time t of a conventional Rapid Thermal Annealing (RTA) process.
Figure 2A:
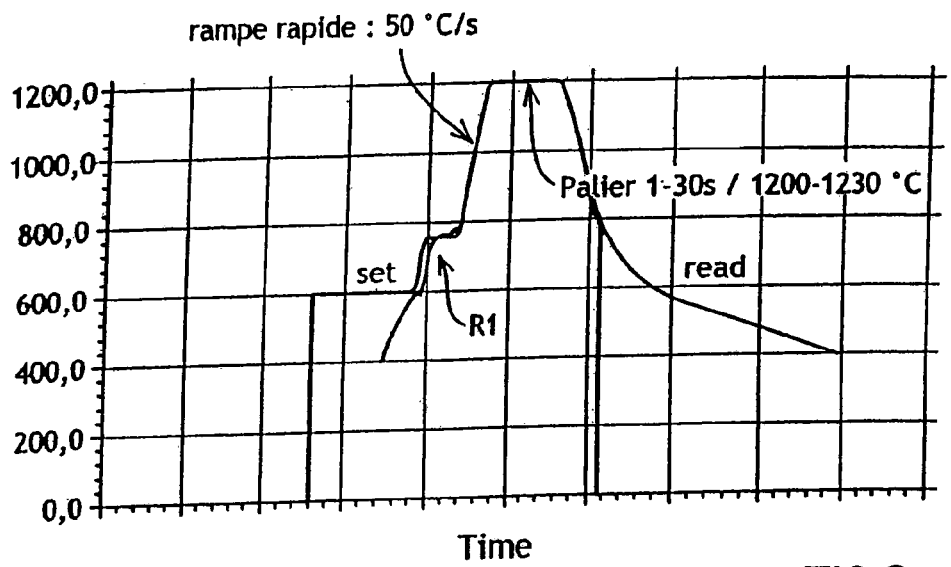
FIG. 2a is a graph of the temperature over time of a conventional RTA process that proceeds in a continuous manner.
Figure 2B:
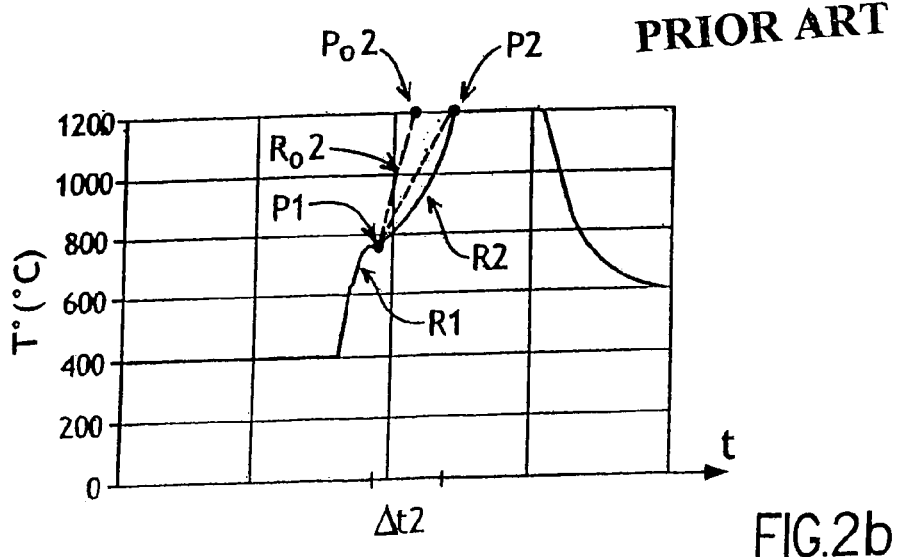
FIG. 2b is a graph of the temperature over time of an RTA process according to the invention.

FIG. 2a shows the change in temperature over time during a conventional RTA process, and FIG. 2b shows the change in temperature over time during an RTA process according to the invention. Both FIGS. 2a and 2b concern RTA annealing of an SOI wafer, wherein the SOI wafer was formed using a transfer process that included detachment along a zone of weakness (such as by using a SMART-CUT® type process). However, the present technique also applies to wafers obtained via any type of transfer process (for example, by using an ELTRAN® type process or some other method), and to wafers other than those having an SOI type structure. The process thus applies to silicon wafers, or to wafers made of other semiconductor materials.

The temperature increases shown in FIGS. 2a and 2b correspond to two different RTA processes, wherein the example process illustrated in FIG. 2b is carried out according to the invention. The temperature increases of both processes begin in generally the same manner, with a first ramp of temperature increase R1 taking the wafer to a temperature value of about 750° C. A first constant temperature halt or pause (at a value of about 750° C.) follows the first ramp. As can be seen in these figures, the difference between the two annealing processes lies in the second ramp R2 of temperature increase, which follows the end of the first pause. In fact, the second ramp shown in FIG. 2a is substantially rectilinear, and has a constant slope of about 50° C. per second. Further, the conventional RTP process of FIG. 2a ends with a halt or pause of about 1 to 30 seconds, during which the temperature is maintained at a constant value of about 1200 to about 1230° C.

As shown in FIG. 2b, the second ramp R2 of temperature increase is not rectilinear. Rather, this second ramp R2 has a generally concave shape, meaning that it generally extends below the straight line that joins the point P1 to the point P2 (represented as a dotted line). The point P1 is at the start of the second ramp R2 (which corresponds to a temperature of about 750° C.) and the point P2 is at the end of the second ramp (which corresponds to a temperature of about 1150–1250° C.).

In particular, the first portion of the second ramp R2 has an average slope of a first value within a first, low range of temperatures, and a second portion of the second ramp R2 has an average slope of a second, increased value within a second, high range of temperatures. In other words, during the temperature increase of the second ramp, proportionally more time is spent initially for a given temperature rise (first range), than during the latter part of the ramp (second range).

In addition, the second ramp R2 of the present method is associated with a duration $\Delta t2$ of temperature increase that greater than the duration of the temperature increase of a second ramp during a conventional RTA process corresponding to the same difference in temperature. Referring to FIG. 2b, the duration $\Delta t2$ corresponds to the time difference between the point P1 (at the start of the second ramp R2) and the point P2 (at the end of the second ramp R2).

For illustrative and comparative purposes, a dotted line representation of a conventional ramp $R_0 2$, as practiced according to the state of the art, has been included in FIG. 2b. This conventional ramp $R_0 2$ starts at the same point P1, but ends at point $P_0 2$, which is different from that of the point P2 and precedes it in time. Thus, as compared to the dotted line representation of the rectilinear conventional ramp $R_0 2$, the second ramp R2 according to the present method is concave and has an average slope which increases between two successive ranges, and additionally includes a slower overall temperature rise.

More precisely, in the conventional RTA process example of FIG. 2a, the second ramp has a slope which increases uniformly progressively and continuously. The slope of the RTA process of the present invention successively has the following values: 10–15–25–50° C. per second. In contrast, the rate of the ramp in FIG. 2a is unchanging and remains at 50° C. per second. Ramp R2 in FIG. 2b has different slopes and only ends with a maximum slope of about 500° C. per second so that its overall rate is less than 50° C. per second.

An important characteristic of the ramp R2 is that it allows the wafer to spend an increased amount of time in the range of low temperatures, which starts around 750° C., before the ramp ends at a temperature of about 1150–1250° C. In the present example shown in FIG. 2b, the low range of temperatures correspond to temperatures in the range of between about 800° C. and about 1100° C.

It is to be noted that the time spent by the wafer undergoing RTA is increased in a low range of temperatures of the second ramp as compared to a conventional RTA process. This increase is "absolute", in the sense that the time actually spent in this low range is increased in comparison with that of a conventional RTA process. The increased time spent can also be considered in relation to the second ramp in general. It is noted that according to the present method, during this second ramp, the ratio of the time spent in the low range of R2 to the time passed in the high range (which corresponds to temperatures of the second ramp that are greater than the temperatures in the "low" range) is increased in comparison with that practiced in the state of the art. In other words, according to the invention, more time is spent in this "low" temperature range of the second ramp as compared to the total duration of the second ramp than in the annealing stages of the linear ramp as per the state of the art. In fact, during the second ramp, the average slope of temperature increase has a first value within the first range of "low" temperatures and then increases within the range of "high" temperatures. The ranges of "low" and "high" temperatures are defined according to the material of the wafer.

It is also possible to implement the invention with another "second ramp" that starts from the moment that the condition regarding the ratio of time spent in the low and high temperature ranges explained above occurs. It is for example possible to define an intermediate constant temperature pause or halt in the range of low temperatures (for example a halt at a temperature between 800 and 1100° C., in the example described here). Generally speaking, it is possible for the second ramp to take any form which allows this condition to be fulfilled. Proceeding in a manner according to the present process allows the number of slip lines on the wafer after annealing to be substantially reduced.

It has been observed that the slip lines engendered on the supports of the wafer in an oven are considerably reduced (whether these supports have the form of separate points of support, or of a continuous circular ring, concentric to the wafer). This effect is explained by the fact that the slip lines observed in the wafer at the end of RTA originate in faults that occur during the part of the RTA process that corresponds to the "low" temperature values. This effect is illustrated in FIG. 3, which represents the number of slip lines produced on a wafer after annealing, for four conditions of RTA carried out on four respective wafers.

Figure 3:
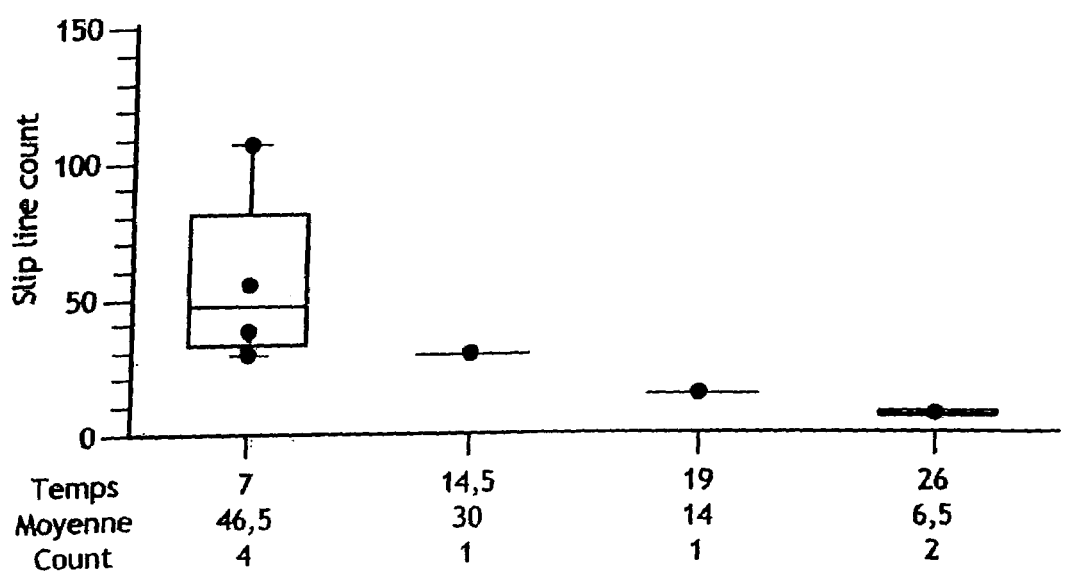
FIG. 3 is a graph plotting the number of slip lines that result on four wafers after RTA processes are conducted at four different time interval and temperature conditions.

Referring to FIG. 3, the four annealing stages correspond to the series of points spread out along the abscissa, wherein each different abscissa corresponds to a separate annealing process. Lines of data appear below the graph. The first line of "time" data indicates, for each annealing process, the time spent in the range of "low" temperatures of the second ramp R2, and the four annealing processes including the same first ramp R1, similar to that of FIG. 2b. The second line of "Average" data corresponds to the number of slip lines observed on a population of wafers, after annealing. The third line of "Count" data indicates the number of wafers on which the slip lines have been counted (this number being limited to one in two cases). It can be observed that as the "time" increases, the number of slip lines decreases. The table below sets forth the results obtained:

| Time passed in the low temperature range (in seconds) | Average number of slip lines observed |
| --- | --- |
| 7 | 46.5 |
| 14.5 | 30 |
| 19 | 14 |
| 26 | 6.5 |

In the example of FIG. 3, the range of "low temperatures" extended between 800 and 1100° C. As described, the application of a second progressive ramp of RTA, which corresponds to a high ratio (time spent in the "low" temperature range to the time passed in the "high" temperature range), is thus beneficial for reducing the number of slip lines.

What is claimed is:

1. A method for minimizing slip line faults on a surface of a semiconductor wafer that has been obtained using a transfer technique, which comprises:
   heating such semiconductor wafer from an ambient temperature to a first higher temperature;
   pausing the heating at the first higher temperature for a time sufficient to stabilize the wafer; and
   further heating the wafer from the first higher temperature to a target higher temperature during a predetermined time interval, with the further heating during an initial portion of the time interval being conducted at a relatively low heating rate and heating during a final portion of the time interval being conducted at a relatively higher heating rate to provide additional heating time compared to a heating time provided by a constant heating rate to thus minimize slip line faults in the surface of the wafer.

2. The method of claim 1 wherein the further heating during the predetermined time interval is not uniform and is conducted at an overall rate that is less than 50° C./sec.

3. The method of claim 2 wherein the further heating continuously increases from the low heating rate to the high heating rate.

4. The method of claim 3 wherein the low heating rate is conducted from more than 50% to about 80% of the predetermined time interval and the high heating rate is conducted from about less than 50% to about 20% of the predetermined time interval.

5. The method of claim 1 which further comprises pausing the heating during the initial portion of the time interval and then resuming heating.

6. The method of claim 1 wherein the ambient temperature is room temperature and the first higher temperature is about 700 to 800° C.

7. The method of claim 1 wherein the low heating rate of the further heating is conducted from the first higher temperature to an intermediate temperature of between about 800 to about 1100° C., and the high heating rate of the further heating is conducted from the intermediate temperature to the target temperature.

8. The method of claim 1 wherein the target temperature is about 1100 to 1300° C.

9. The method of claim 1 wherein the high heating rate of the further heating is about 25 to 500° C. per second.

10. The method of claim 1 wherein the wafer is made of silicon.

11. The method of claim 1 wherein the wafer is an SOI wafer.

12. The method of claim 1 wherein the first higher temperature is about 700 to 800° C.; and the further heating is to a target higher temperature of about 1100 to 1300° C. and with the relatively low heating rate conducted to an intermediate temperature of about 800 to 1100° C.

13. The method of claim 12 wherein the low heating rate is conducted from more than 50% to about 80% of the predetermined time interval and the high heating rate is conducted from less than 50% to about 20% of the predetermined time interval.

14. The method of claim 12 which further comprises pausing the heating during the initial portion of the time interval and then resuming heating.

15. The method of claim 12 wherein the first higher temperature is around 750° C. and the target temperature is in the range of about 1150 to 1250° C.

16. The method of claim 12 wherein the high heating rate of the further heating is about 25 to 50° C. per second.

17. The method of claim 12 wherein the wafer is made of silicon.

18. The method of claim 12 wherein the wafer is an SOI wafer.

19. In a method for minimizing sup line faults on a surface of a semiconductor wafer that has been obtained using a transfer technique, wherein the wafer has been heated from an ambient temperature to a first higher temperature and a pause has been taken at the first higher temperature for a time sufficient to stabilize the wafer, the improvement comprising further heating the wafer from the first higher temperature to a target higher temperature during a predetermined time interval, with the further heating during an initial portion of the time interval being conducted at a relatively low heating rate and heating during a final portion of the time interval being conducted at a relatively higher heating rate so that the overall heating time is longer than an overall heating time when heating is conducted at a uniform heating rate at 50° C./sec to thus minimize slip line faults in the surface of the wafer.

20. A method for minimizing slip line faults on a surface of a semiconductor wafer that has been obtained using a transfer technique, which comprises:

heating such semiconductor wafer from an ambient temperature to a first higher temperature;

pausing the heating at the first higher temperature for a time sufficient to stabilize the wafer; and further heating the wafer from the first higher temperature to a target higher temperature during a predetermined time interval, with the further heating during an initial portion of the time interval being conducted at a relatively low heating rate and heating during a final portion of the time interval being conducted at a relatively higher heating rate to thus minimize slip line faults in the surface of the wafer, wherein the further heating is conducted at a non-rectilinear heating rate.

* * * * *

UNITED STATES PATENT AND TRADEMARK OFFICE
CERTIFICATE OF CORRECTION

PATENT NO. : 7,138,344 B2  Page 1 of 1
APPLICATION NO. : 10/671813
DATED : November 21, 2006
INVENTOR(S) : Neyret et al.

It is certified that error appears in the above-identified patent and that said Letters Patent is hereby corrected as shown below:

Column 4:
Line 54, delete "500°" and insert -- 50° --.

Column 6:
Line 52 (claim 9, line 2), delete "500°" and insert -- 50° --.

Column 7:
Line 13 (claim 19, line 1), delete "sup" and insert -- slip --.

Signed and Sealed this

Ninth Day of January, 2007

JON W. DUDAS
*Director of the United States Patent and Trademark Office*